(12) United States Patent
Nakanishi et al.

(10) Patent No.: US 8,970,269 B2
(45) Date of Patent: Mar. 3, 2015

(54) PULSE WIDTH MODULATOR AND SWITCHING AMPLIFIER

(71) Applicant: Onkyo Corporation, Osaka (JP)

(72) Inventors: Yoshinori Nakanishi, Osaka (JP); Mamoru Sekiya, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 14/132,595

(22) Filed: Dec. 18, 2013

(65) Prior Publication Data

US 2014/0185836 A1 Jul. 3, 2014

(30) Foreign Application Priority Data

Dec. 28, 2012 (JP) ................. 2012-286699

(51) Int. Cl.
*H03K 5/04* (2006.01)
*H03F 3/217* (2006.01)

(52) U.S. Cl.
CPC . *H03F 3/217* (2013.01); *H03K 5/04* (2013.01)
USPC .......................................... 327/172; 327/176

(58) Field of Classification Search
USPC ......................................... 327/172–174, 176
See application file for complete search history.

(56) References Cited

U.S. PATENT DOCUMENTS

| 7,453,298 | B1 * | 11/2008 | Mlcousek et al. | ............ 327/172 |
| 7,535,276 | B2 * | 5/2009 | Mlcousek et al. | ............ 327/175 |

FOREIGN PATENT DOCUMENTS

| JP | 2006206128 | 8/2006 |
| JP | 2006352269 | 12/2006 |
| JP | 2009094555 | 4/2009 |
| JP | 2009135718 | 6/2009 |
| JP | 2010200290 | 9/2010 |
| JP | 2010-273326 | 12/2010 |

* cited by examiner

*Primary Examiner* — An Luu
(74) *Attorney, Agent, or Firm* — Renner, Otto, Boisselle & Sklar, LLP

(57) ABSTRACT

A pulse width modulation signal with a less distortion component that is not influenced by a common-mode noise or an offset voltage is generated. Pulse signal generation circuits 6, 7 generate pulse signals S1, S2 whose pulse widths are discharge times t1, t2 of integrators 3, 4, respectively, a PWM signal generation circuit 8 detects discharge end timings of the integrators 3, 4 based on the pulse signals S1, S2, and a pulse whose pulse width is a time between discharge end timing of one of the integrators 4 and discharge end timing of the other one of the integrators 3 is generated so as to be output as a PWM signal $S_{pwm}$.

5 Claims, 10 Drawing Sheets

PULSE WIDTH MODULATOR AND SWITCHING AMPLIFIER

BACKGROUND OF THE INVENTION

1. Field of the Invention

The present invention relates to a pulse width modulator for pulse-width modulating (PWM), for example, an audio signal and outputting the modulated signal, and a switching amplifier using the pulse width modulator.

2. Description of the Related Art

Conventionally, Japanese Patent Application Laid-Open No. 2010-273326 proposes, for example, a current-integrated pulse width modulator (hereinafter, simply referred to as "an integrated pulse width modulator"). The integrated pulse width modulator converts an amplitude of an audio signal (voltage signal) into an electric current, charges a capacitor with the electric current for a constant time, and discharges charged electric charges of the capacitor with the constant electric current so as to convert the audio signal into a pulse width modulation signal (hereinafter, referred to as "PWM signal") whose pulse width is a discharging time of the capacitor.

FIG. 7 is a block diagram illustrating a basic circuit configuration of the integrated pulse width modulator disclosed in Japanese Patent Application Laid-Open No. 2010-273326. FIG. 8 is a diagram illustrating one example of concrete circuits of two pulse signal generation circuits and a pulse signal synthesizing circuit in the pulse width modulator.

An integrated pulse width modulator 100 includes a control signal generation circuit 101, a voltage to current converting circuit 102, four switching circuits SW1 to SW4, two integrators 103 and 104, one discharging circuit 105, two pulse signal generation circuits 106 and 107, and one pulse signal synthesizing circuit 108.

The integrated pulse width modulator 100 generates a PWM signal $S_{PWM}$ according to the following principal such that:

(1) an audio signal (voltage signal) is converted into an electric current $i_s$ that changes in proportion to its amplitude;

(2) an operation for storing electric charges in the integrator 103 with the electric current $i_s$ for a high-level duration of a reference clock in a period T and discharging the stored charges in the integrator 103 with a constant current $I_d$ for a low-level duration through the discharging circuit 105 is repeated, and the pulse signal generation circuit 106 generates a pulse signal S1 whose pulse width is a discharging time $t_d$ at every time of a charge storage operation in the integrator 103;

(3) further, an operation for storing electric charges in the integrator 104 with the electric current $i_s$ for the low-level duration of the reference clock in the period T and discharging the stored charges in the integrator 104 with the constant current $I_d$ for the high-level duration through the discharging circuit 105 is repeated, and the pulse signal generation circuit 107 generates a pulse signal S2 whose pulse width is a discharging time $t_d$ at every time of a charge storage operation in the integrator 104; and (4) the pulse signal synthesizing circuit 108 synthesizes the pulse signal S1 and the pulse signal S2 so that respective pulses of the pulse signal S1 and respective pulses of the pulse signal S2 are connected to each other alternately.

The control signal generation circuit 101 generates a control signal φ1 that is identical to the reference clock MCLK and a control signal φ2 obtained by inverting the level of the reference clock MCLK based on the reference clock MCLK having a predetermined period T. Further, the control signal generation circuit 101 outputs a set signal set1 obtained by detecting fall of the level of the control signal φ1 and a set signal set2 obtained by detecting fall of the level of the control signal φ2. The voltage to current converting circuit 102 is composed of, for example, a circuit for generating a difference voltage of an audio signal $e_s$ with respect to a ground level through a differential amplifier circuit and converting the difference voltage into an electric current. The switching circuits SW1 to SW4 are composed of semiconductor switches such as bipolar transistors. The integrators 103 and 104 are composed of capacitors having the same capacity (see capacitors C1 and C2 in FIG. 8). The pulse signal generation circuits 106 and 107 are composed of a /RS flip-flop circuit (symbol "/" represents negative logic. Hereinafter, the much the same is true on the description about a flip-flop circuit.) that is composed of, for example, a NAND logic gate shown in FIG. 8 for inputting a set/reset signal based on a negative logic. The pulse signal synthesizing circuit 108 is composed of a NAND circuit shown in FIG. 8.

FIG. 9 is a time chart illustrating an operation for generating a PWM signal of the integrated pulse width modulator 100. In the time chart in FIG. 9, the switching circuits SW1 to SW4 perform an ON operation when the control signals φ1 to φ4 are at a high level, and perform an OFF operation at a low level. Further, the pulse signal generation circuits 106 and 107, and the pulse signal synthesizing circuit 108 are composed of a circuit shown in FIG. 8.

The control signals φ1 and φ2 shown in FIG. 9 are clocks whose period is the same as that of the reference clock generated by the control signal generation circuit 101 based on the reference clock MCLK. The control signal φ1 controls an ON/OFF operation of the switching circuit SW1, and the control signal φ2 controls an ON/OFF operation of the switching circuit SW3. A control signal φ3 is a signal outputted from a Q output of the pulse signal generation circuit (a /RS flip-flop circuit) 106, and controls an ON/OFF operation of the switching circuit SW2. A control signal φ4 is a signal outputted from a Q output of the pulse signal generation circuit (a /RS flip-flop circuit) 107, and controls an ON/OFF operation of the switching circuit SW4. The set signal set1 is a signal inputted into a /S input of the pulse signal generation circuit (the /RS flip-flop circuit) 106, and a signal obtained by detecting fall of the control signal φ1. Further, the set signal set2 is a signal inputted into a /S input of the pulse signal generation circuit (the /RS flip-flop circuit) 107, and a signal obtained by detecting fall of the control signal φ2.

A waveform of V1 represents a change in a both-end voltage V1 of the capacitor C1 caused by charging the capacitor C1 with an electric current $i_s$ outputted from the voltage to current converting circuit 102 for a period in which the control signal φ1 is at the high level, and discharging the capacitor C1 with a constant electric current $I_d$ through the discharging circuit 105 for a low-level period. A waveform of V2 represents a change in a both-end voltage V2 of the capacitor C2 caused by charging the capacitor C2 with the electric current $i_s$ outputted from the voltage-current converting circuit 102 for a period in which the control signal φ2 is at the high level, and discharging the capacitor C2 with the constant electric current $I_d$ through the discharging circuit 105 for a low-level period.

In pulse width modulation of the audio signal $e_s$, a reference level (0 V) of an amplitude fluctuation in the audio signal $e_s$ is allocated to a modulation degree 0[%] of PWM signal $S_{PWM}$. When the amplitude is larger than 0 V, a modulation degree m changes in proportion to the amplitude in a positive direction within a range of 0 to 100[%], and when the amplitude is smaller than 0 V, the modulation degree m changes in proportion to the amplitude in a negative direction within the range of 0 to 100 [%].

The electric current $i_s$ outputted from the voltage to current converting circuit 102 is expressed by $i_s=I_o\pm k\cdot|e_s|$. When the amplitude of the audio signal $e_s$ is 0 (no signal), an electric current $I_0$ is outputted from the voltage to current converting circuit 102. The waveforms of V1 and V2 in FIG. 9 are waveforms when the amplitude of the audio signal $e_s$ is 0 (no signal), and a discharge time $t_d$ of the waveform of V1 and a discharge time $t_d{}'$ of the waveform of V2 are ½ of an OFF time t of the control signals φ1 and φ2. When the amplitude is larger than 0 V in the negative direction, the electric current $i_s$ is such that $i_s=I_o-k\cdot|e_s|$. For this reason, waveforms of charge and discharge of the capacitors C1 and C2 are as illustrated by a broken line of the waveform of V1, and the discharge times $t_d$ and $t_d{}'$ are shorter than t/2. On the contrary, when the amplitude is larger than 0 V in the positive direction, the electric current $i_s$ is such that $i_s=I_o+k\cdot|e_s|$. For this reason, the waveforms of the charge and discharge of the capacitors C1 and C2 are as illustrated by an alternate long and short dash line of the waveform of V1, and the discharge times $t_d$ and $t_d{}'$ are longer than t/2.

The pulse signal S1 is a signal outputted from a /Q output of the pulse signal generation circuit (the /RS flip-flop circuit) 106 shown in FIG. 8, and the control signal φ3 is a signal outputted from the Q output of the pulse signal generation circuit (the /RS flip-flop circuit) 106. When the low-level signal set1 detecting fall of the control signal φ1 is inputted into the /S input, the Q output of the pulse signal generation circuit (the /RS flip-flop circuit) 106 is inverted into the low level, and thereafter when the voltage V1 of the capacitor C1 is lowered into a reference voltage $V_{th}$ (a voltage to be a reference at a charging start time of the capacitor C1) by discharge, the /Q output is inverted into the high level and maintain the high level until next input of the signal set1. For this reason, the pulse signal S1 has a rectangular wave in such that it is at the low level for the discharge time $t_d$ of the capacitor C1.

Since the control signal φ3 is such that the level of the pulse signal S1 is inverted, it becomes a pulse signal that is at the high level for the discharge time $t_d$ of the capacitor C1. Since the pulse signal generation circuit (the /RS flip-flop circuit) 107 also operates similarly to the pulse signal generation circuit (the /RS flip-flop circuit) 106, the pulse signal S2 has a rectangular wave such that it is at the low level for a discharge time $t_d{}'$ of the capacitor C2, and the control signal φ4 becomes a pulse signal that is at the high level for the discharge time $t_d{}'$ of the capacitor C2.

A PWM signal $S_{PWM}$ is a signal that is outputted from the pulse signal synthesizing circuit 108. Since the pulse signal synthesizing circuit 108 outputs a calculated result of NAND of the pulse signal S1 and the pulse signal S2, the pulse signal synthesizing circuit 108 outputs the PWM signal $S_{PWM}$ that is synthesized so that pulses of the pulse signal S1 and pulses of the pulse signal S2 are connected alternately. When the high-level period is denoted by T1 and the low-level period is denoted by T2, the modulation degree m of PWM signal $S_{PWM}$ is expressed by:

$$m=|T1-T2|\times 100/(T1+T2)[\%].$$

The integrated pulse width modulator 100 is configured so that when a common-mode noise or a distortion in a time axial direction occurs in a process that the PWM signal is generated from the audio signal $e_s$, an error component $\Delta t_s$ caused by the noise or the distortion is directly generated.

The conventional integrated pulse width modulator 100 is configured so that both the two integrators 103 and 104 are charged with the same electric current $i_s$. For this reason, when a common-mode noise occurs and an error component $\Delta i_s$ is mixed in the electric current $i_s$, both the pulse widths of the pulse signals S1 and S2 generated by the pulse signal generation circuits 106 and 107, respectively include an error generation $\Delta t_s$ on basis of the error component $\Delta i_s$. Since the PWM signal $S_{PWM}$ is a NAND signal of the pulse signal S1 and the pulse signal S2, the error component $\Delta t_s$ of the pulse signals S1 and S2 is superimposed on the modulation degree m of the PWM signal $S_{PWM}$, and the PWM signal becomes a signal on which a common-mode noise or harmonics is superimposed.

SUMMARY OF THE INVENTION

It is an object of the present invention to provide a pulse width modulator for accurately performing PWM conversion without an influence on common-mode noise or a distortion, and a switching amplifier using the pulse width modulator.

A pulse width modulator of the present invention comprising: a first voltage to current converting section for converting an AC voltage signal to be inputted into a first electric current expressed by a linear function having an inclination proportional to an amplitude of the AC voltage signal; a second voltage to current converting section for converting the AC voltage signal into a second electric current having an inclination opposite to the first electric current; a first charging/discharging control section for repeating a charging/discharging operation for charging a first electric charge storage section with the first electric current for a predetermined time and discharging the electric charges stored in the first electric charge storage section with a predetermined constant current in a period twice as long as the predetermined time; a second charging/discharging control section for repeating a charging/discharging operation for charging a second electric charge storage section with the second electric current for the predetermined time and discharging the electric charges stored in the second electric charge storage section with the predetermined constant current in the period with shifting the predetermined time for the charging/discharging operation of the first electric charge storage section through the first charging/discharging control section; a first discharge timing detecting section for detecting the discharge end timing every time when the discharge of the stored electric charges in the second electric charge storage section is ended; a second discharge timing detecting section for detecting the discharge end timing every time when the discharge of the stored electric charges in the first electric charge storage section is ended; and a pulse width modulation signal generation section for generating a pulse whose pulse width is a time interval between a first discharge end timing detected by the first discharge timing detecting section and a subsequent second discharge end timing detected by the second discharge timing detecting section, and outputting a signal of a pulse string as a pulse width modulation signal.

Preferably, the first voltage to current converting section includes a differential amplifier circuit which the AC voltage signal is inputted into its one input, and which a feedback signal that is fed back in order to correct the AC voltage signal is inputted into the other input or whose the other input is set to the reference level of the AC voltage signal, and a first electric current generation circuit for generating an electric current proportional to one of the output voltages from the differential amplifier circuit, the second voltage to current converting section includes the differential amplifier circuit, and a second electric current generation circuit for generating an electric current proportional to the other output voltage from the differential amplifier circuit.

Preferably, the first charging/discharging control section includes a first control signal generation section for outputting a first control signal composed of a clock signal having the period and a first detection signal for detecting a timing at which a level of the first control signal is inverted to a predetermined direction, a second control signal generation section for generating a second control signal composed of a pulse signal whose pulse width is a discharge time of the first electric charge storage section based on the first detection signal and a level of a discharging voltage of the first electric charge storage section, a first switching section that is provided between the first voltage to current converting section and the first electric charge storage section, and controls connection between the first voltage to current converting section and the first electric charge storage section according to the first control signal, a first discharging section that is provided between the first electric charge storage section and a ground line or a power supply line, and discharges the stored electric charges of the first electric charge storage section with the predetermined constant current to the ground line or the power supply line when the first discharging section is connected to the first electric charge storage section, and a second switching section that is provided between the first electric charge storage section and the first discharging section, and controls connection between the first electric charge storage section and the first discharging section according to the second control signal, the second charging/discharging control section includes a third control signal generation section for outputting a third control signal obtained by inverting a level of the first control signal, and a second detection signal for detecting a timing at which a level of the third control signal is inverted to the predetermined direction, a fourth control signal generation section for generating a fourth control signal composed of a pulse signal whose pulse width is a discharge time of the second electric charge storage section based on the second detection signal and a level of a discharging voltage of the second electric charge storage section, a third switching section that is provided between the second voltage to current converting section and the second electric charge storage section, and controls connection between the second voltage to current converting section and the second electric charge storage section according to the second control signal, a second discharging section that is provided between the second electric charge storage section and a ground line or a power supply line, and discharges the stored electric charges of the second electric charge storage section into the ground line or the power supply line with the predetermined constant current when the second discharging section is connected to the second electric charge storage section, a fourth switching section that is provided between the second electric charge storage section and the second discharging section, and controls connection between the second electric charge storage section and the second discharging section according to the fourth control signal.

Preferably, the first control signal generation section and the second control signal generation section are composed of a control signal generation circuit including a reference clock generation circuit for generating a reference clock having the period, and outputting the reference clock as the second control signal, a level inverting circuit for inverting a level of the reference clock so as to output the reference clock as the first control signal, a first differentiator for, when the level of the reference clock is inverted into the predetermined direction, outputting a signal having a differentiated waveform of the level change as the second detection signal, and a second differentiator for, when a level of a signal outputted from the level inverting circuit is inverted into a predetermined direction, outputting a signal having a differentiated waveform of a level change as the first detection signal.

A switching amplifier of the present invention comprising: the above pulse width modulator; a voltage supply for outputting a predetermined power supply voltage; and a switching circuit for switching a predetermined power supply voltage supplied from the voltage supply based on a pulse width modulation signal output from the pulse width modulator.

According to the present invention, when a first electric current $i_1$ is such that $i_1 = I_o + A \cdot |e_s|$ ($I_o$ denotes a current value at the time of no signal, A denotes a conversion conductance, and $e_s$ denotes an AC voltage signal to be inputted), a second electric current $i_2$ is expressed by $i_2 = I_o - A \cdot |e_s|$. A discharge time t1 for which a first electric charge storage section is charged with the first electric current $i_1$ for a predetermined time t and then is discharged with a predetermined constant current is proportional to a level of the first electric current $i_1$. For this reason, when a component proportional to $I_o$ is denoted by $t/2$, and a component proportional to $A \cdot |e_s|$ is denoted by $\Delta t$, the discharge time t1 is expressed by $t1 = t/2 + \Delta t$. Similarly, a discharge time t2 for which a second electric charge storage section is charged with the second electric current $i_2$ for the predetermined time t and then is discharged with the predetermined constant current is expressed by $t2 = t/2 - \Delta t$.

The charge/discharge operation of the first electric charge storage section and the charge/discharge operation of the second electric charge storage section are performed with them being shifted by ½ of a period $T = 2 \cdot t$ (t denotes a predetermined charging time) from each other. For this reason, the discharge of the second electric charge storage section and the discharge of the first electric charge storage section are started alternately at time intervals t. Therefore, a time t3 between discharge end timing of the second electric charge storage section and subsequent discharge end timing of the first electric charge storage section is expressed by $t3 = (t - t2) + t1 = t + 2 \cdot \Delta t$. Further, a time t4 between the discharge end timing of the first electric charge storage section and the discharge end timing of the second electric charge storage section is expressed by $t4 = 2 \cdot t - t3$.

Therefore, when a pulse whose pulse width is the time t3 is outputted as a pulse width modulation signal, according to $t3 - t4 = t + 2 \cdot \Delta t - 2 \cdot t + (t + 2 \cdot \Delta t) = 4 \cdot \Delta t$, and $t3 + t4 = 2 \cdot t$, the modulation degree m of the pulse width modulation signal becomes:

$$m = |t3 - t4| \times 100/(t3 + t4)$$
$$= 4 \cdot \Delta t \times 100/(2 \cdot t)$$
$$= (2 \cdot \Delta t/t) \times 100 \ [\%].$$

When an error time caused by a common-mode noise or a distortion is denoted by $t_n$, a discharge times t1' of the first electric charge storage section is expressed by $t1' = t1 + t_n$, and a discharge time t2' of the second electric charge storage section is expressed by $t2' = t2 + t_n$. When the error time $t_n$ caused by a common-mode noise or a distortion is generated, a time t3' between the discharge end timing of the second electric charge storage section and the subsequent discharge end timing of the first electric charge storage section is expressed by $t3' = (t - t2') + t1' = t - t2 - t_n + t1 + t_n = t - t2 + t1 = t + 2 \cdot t$. A time t4' between the discharge end timing of the first electric charge storage section and the discharge end timing of the second electric charge storage section is expressed by t4'=2·t−t3'.

Because of t3'−t4'=(t+2·Δt)−2·t+(t+2·Δt)=4·Δt and t3'+t4'=(t+2·Δt)+2·t−(t+2·Δt)=2·t, even when the error time t, caused by a common-mode noise or a distortion is generated, a modulation degree m' of a pulse width modulation signal is expressed by:

$$m' = |t3' - t4'| \times 100/(t3' + t4')$$
$$= 4 \cdot \Delta t \times 100/(2 \cdot t)$$
$$= (2 \cdot \Delta t/t) \times 100 \ [\%]$$

and a pulse width modulation signal from which the error time $t_n$ is removed is obtained.

DETAILED DESCRIPTION OF THE PREFERRED EMBODIMENTS

Preferred embodiments of the present invention will be concretely described with reference to the accompanying drawings.

Figure 1:
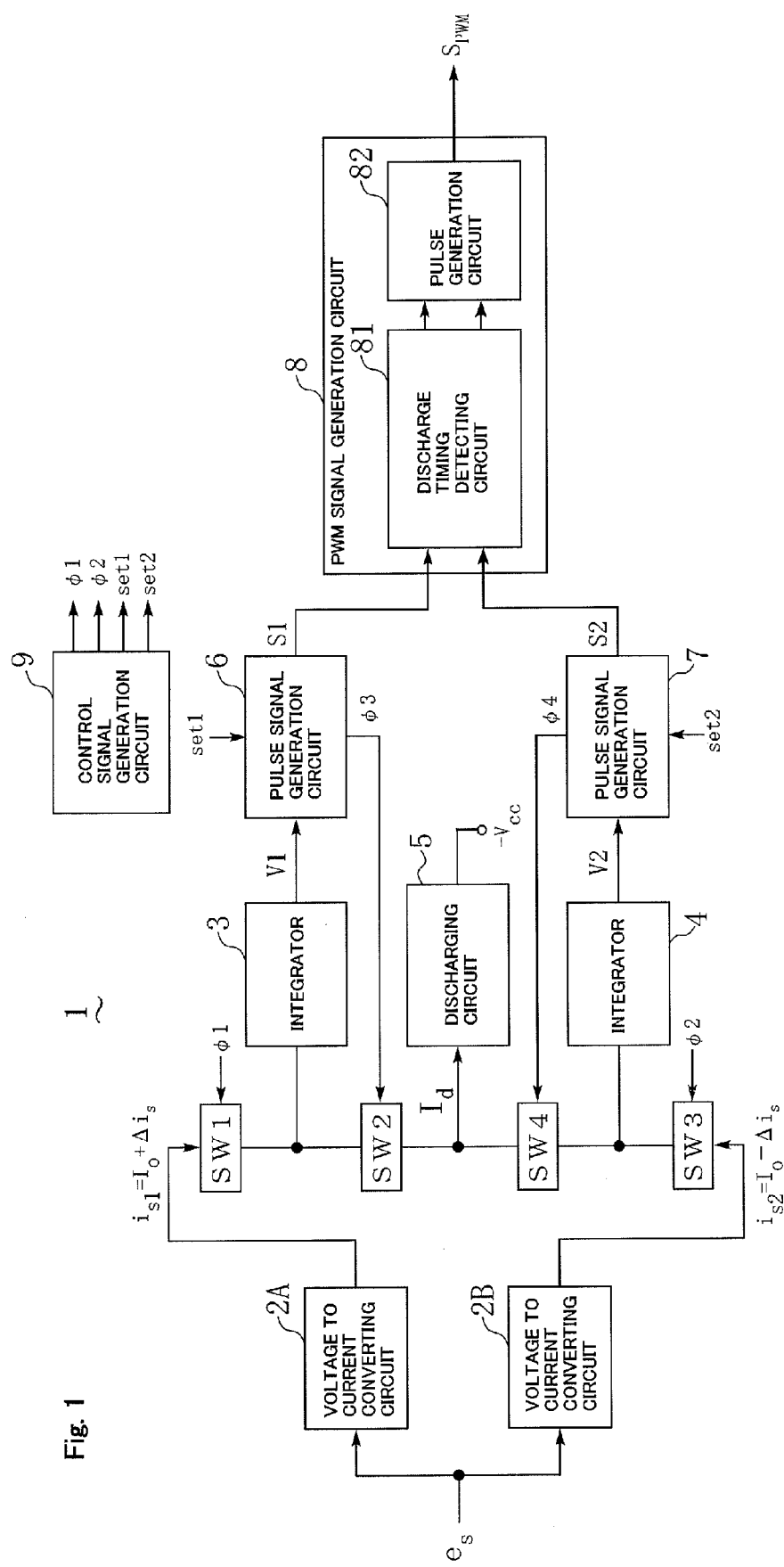
FIG. 1 is a diagram illustrating a block of a basic circuit configuration of an integrated pulse width modulator according to the present invention.

FIG. 1 is a block diagram illustrating a basic circuit configuration of an integrated pulse width modulator according to the present invention.

The integrated pulse width modulator 1 includes two voltage to current converting circuits 2A and 2B, four switching circuits SW1 to SW4, two integrators 3 and 4, one discharging circuit 5, two pulse signal generation circuits 6 and 7, a PWM signal generation circuit 8, and a control signal generation circuit 9.

Figure 7:
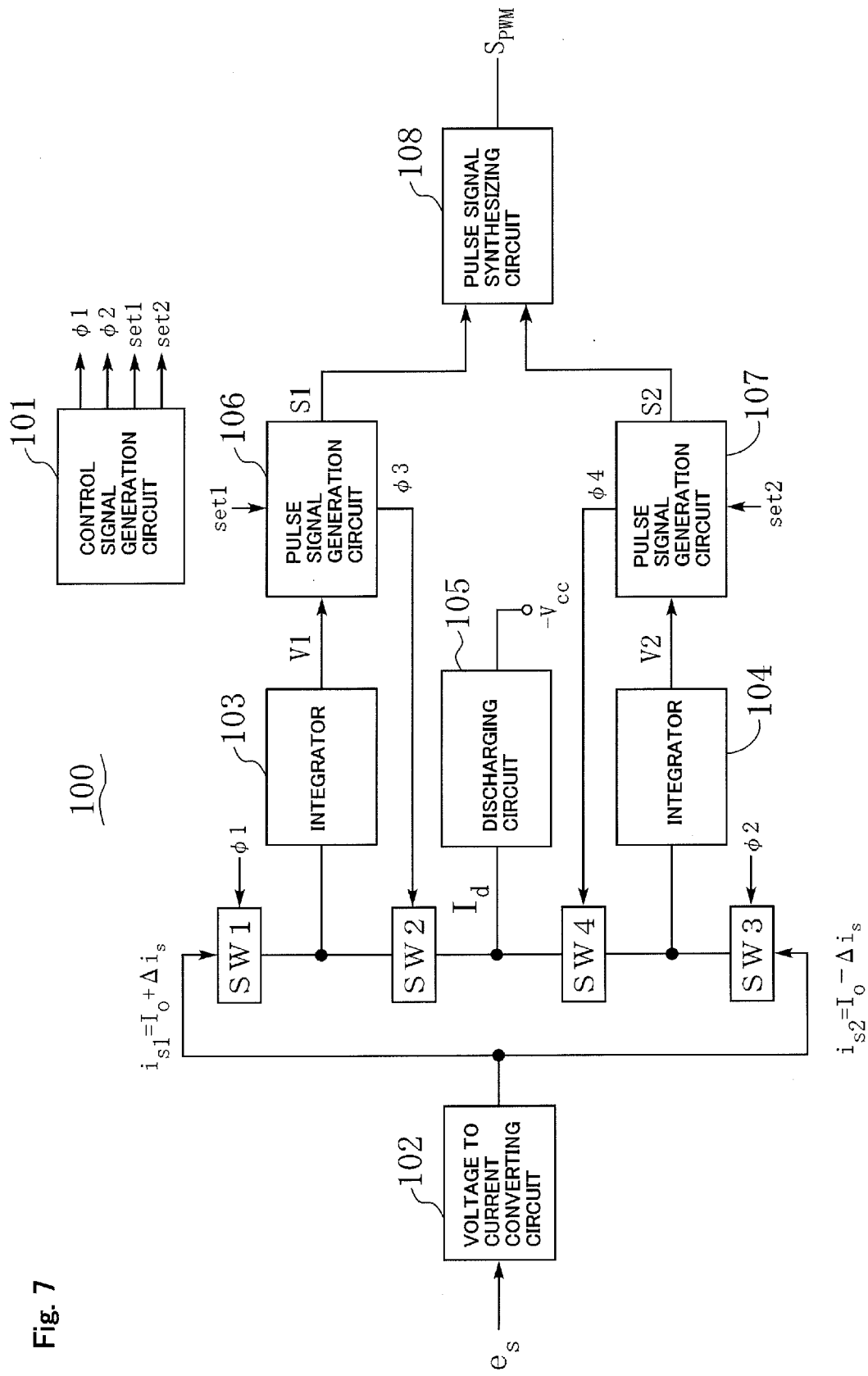
FIG. 7 is a block diagram illustrating a basic configuration of a conventional integrated pulse width modulator.
Figure 8:
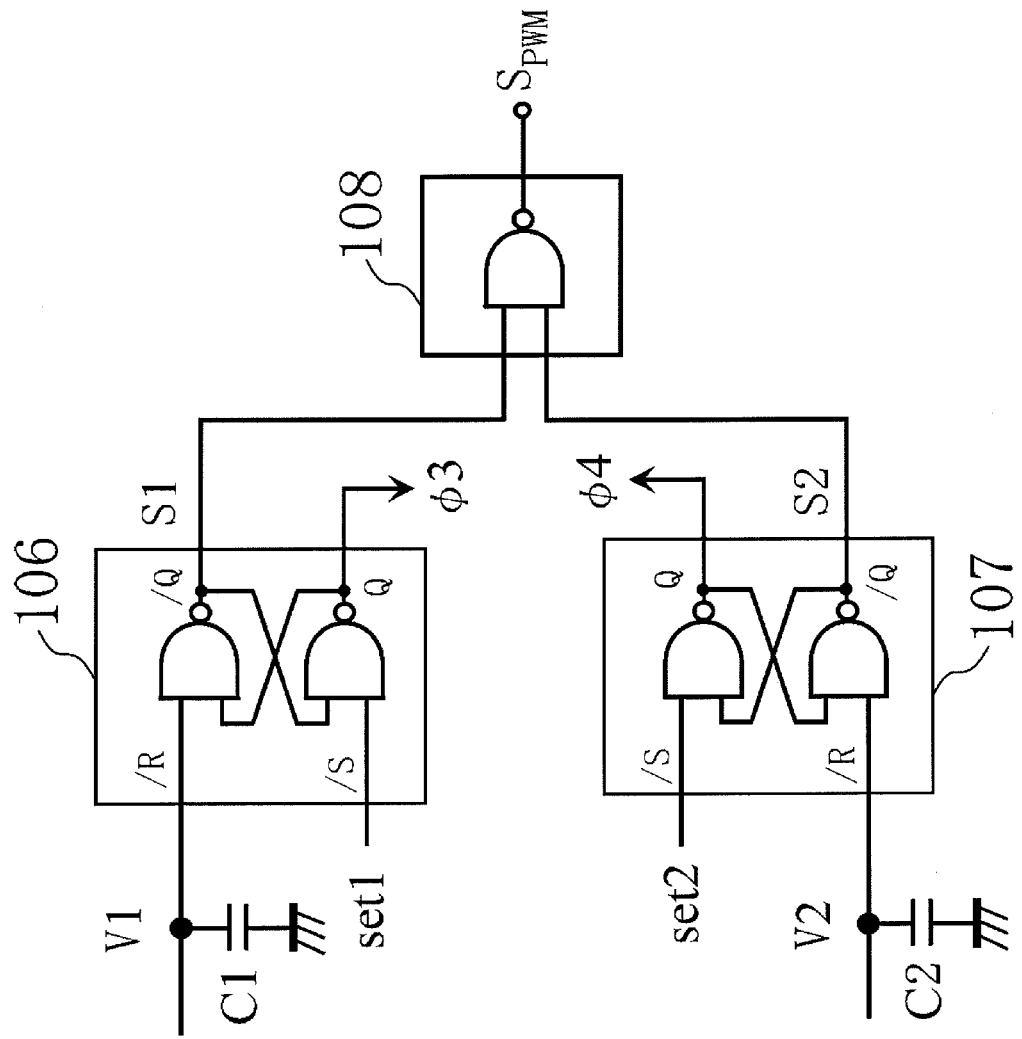
FIG. 8 is a diagram illustrating one example of a concrete circuit of two pulse signal generation circuits and a pulse signal synthesizing circuit in the pulse width modulator shown in FIG. 7.
Figure 9:
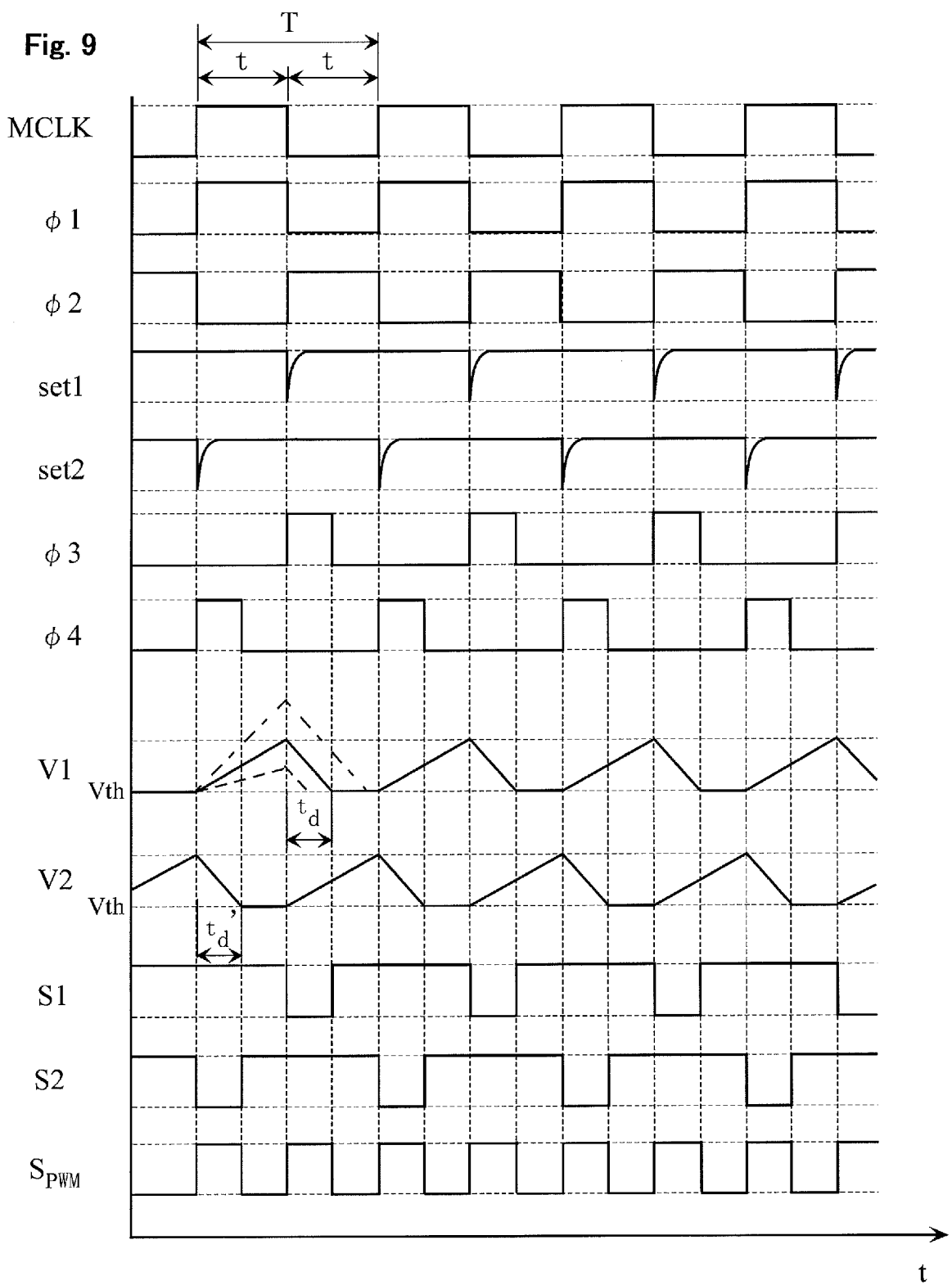
FIG. 9 is a time chart illustrating an operation for generating a PWM signal of the conventional integrated pulse width modulator.
Figure 10:
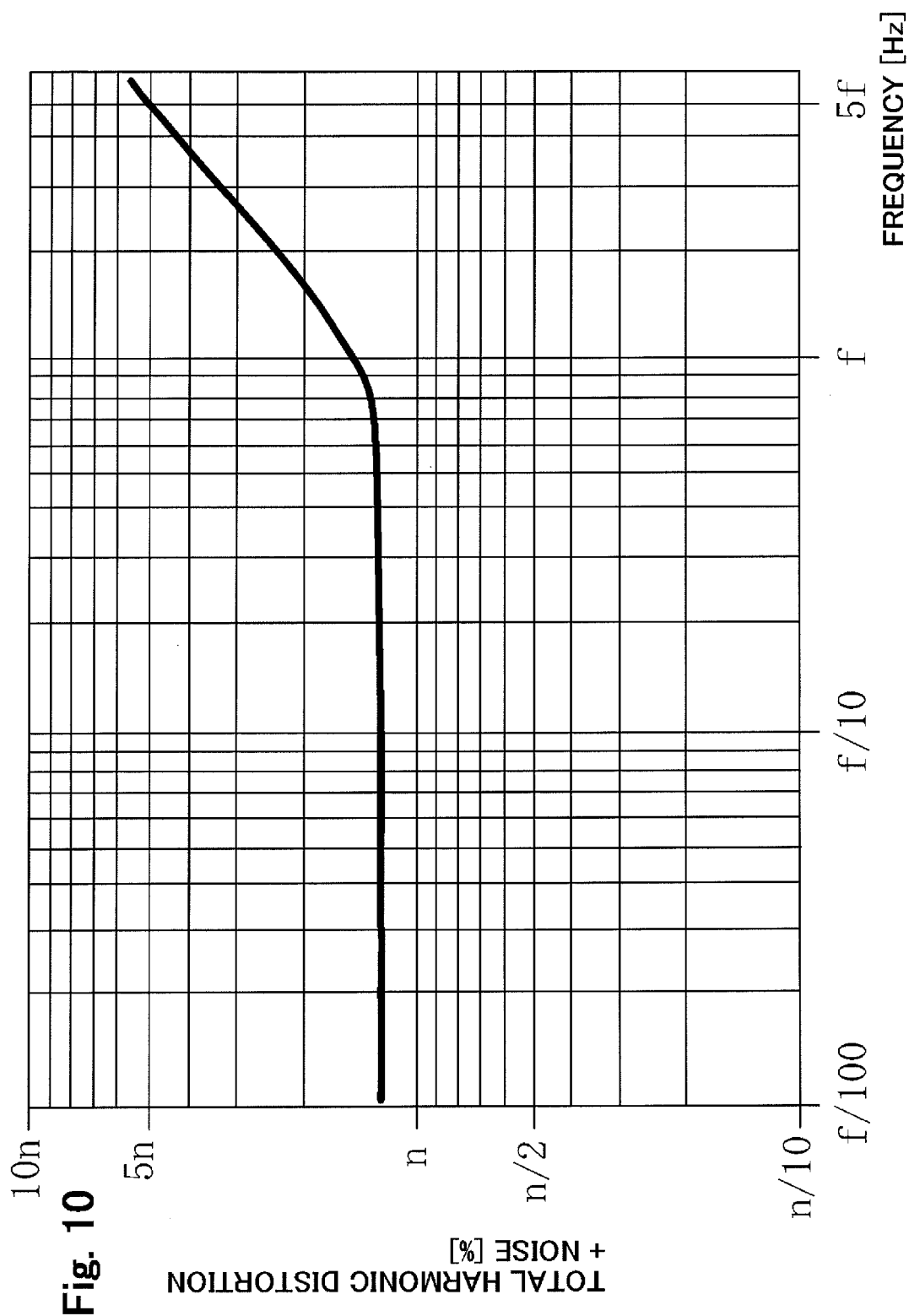
FIG. 10 is a diagram illustrating frequency-total harmonic distortion+noise characteristics of the conventional integrated pulse width modulator.

The voltage to current converting circuit 2A, the switching circuits SW1 to SW4, the integrators 3 and 4, the discharging circuit 5, the pulse signal generation circuits 6 and 7, and the control signal generation circuit 9 correspond to the voltage to current converting circuit 102, the switching circuits SW1 to SW4, the integrators 103 and 104, the discharging circuit 105, the pulse signal generation circuits 106 and 107 and the control signal generation circuit 101 of the conventional integrated pulse width modulator 100 shown in FIG. 7, respectively, and they have the configurations and the functions that are the same as those of the conventional one.

Therefore, the integrated pulse width modulator 1 shown in FIG. 1 is different from the conventional integrated pulse width modulator 100 shown in FIG. 7 in that the voltage to current converting circuit 102 for the integrator 104 is changed into the voltage to current converting circuit 2B that is different from the voltage to current converting circuit 102, and the PWM signal generation circuit 8 is provided instead of the pulse signal synthesizing circuit 108.

The voltage to current converting circuit 2A converts an input audio signal $e_s$ into an electric current $i_{s1}$ expressed by $i_{s1}=I_0 \pm k \cdot |e_s|$, whereas the voltage to current converting circuit 2B converts $k \cdot |e_s|$ into an electric current $i_{s2}$ added to $I_O$ with a symbol being opposite to the voltage to current converting circuit 2A. That is to say, when $0<e_s$, the voltage to current converting circuit 2A outputs the electric current $i_{s1}$ of $I_o+k \cdot |e_s|$, but the voltage to current converting circuit 2B outputs the electric current $i_{s2}$ of $I_o-k \cdot |e_s|$. When $e_s<0$, the voltage to current converting circuit 2A outputs the electric current $i_{s1}$ of $I_o-k \cdot |e_s|$, but the voltage to current converting circuit 2B outputs the electric current $i_{s2}$ of $I_o+k \cdot |e_s|$.

The electric current $i_{s1}$ for charging the integrator 3 and the electric current $i_{s2}$ for charging the integrator 4 establish a relationship such that when one of them is $I_o+k \cdot |e_s|$, the other one is $I_0-k \cdot |e_s|$. As a result, when a component of pulse widths t1 and t2 of pulse signals S1 and S2 generated by the pulse signal generation circuits 6 and 7 through an electric current $I_o$ is denoted by $t_0$ and a component of pulse widths t1 and t2 through an electric current $k \cdot |e_s|$ is denoted by $t_s$, one of the pulse widths t1 and t2 can be $t_0+t_s$ and the other one can be $t_0-t_s$.

When the pulse widths t1 and t2 include a common-mode noise or a distortion in a time axial direction in a process for generating the time t from the audio signal $e_s$, they include an error component $t_n$ due to the distortion. The PWM signal generation circuit 8 synthesizes the pulse signal S1 outputted from the pulse signal generation circuit 6 and the pulse signal S2 outputted from the pulse signal generation circuit 7 so that the error component $t_n$ is canceled, and generates a PWM signal $S_{PWM}$ that does not include harmonics causing a common-mode noise or a common-mode distortion.

Figure 2:
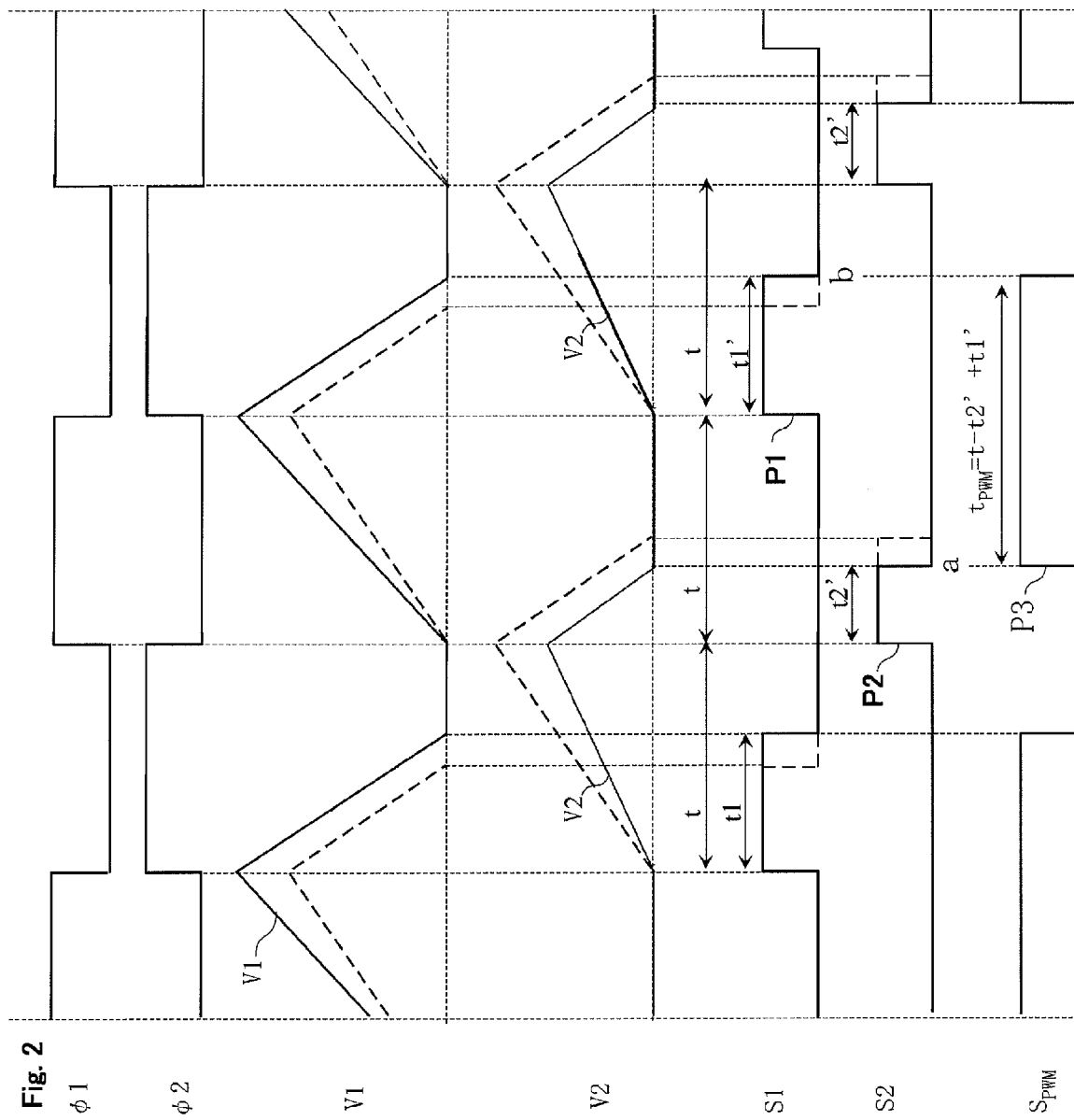
FIG. 2 is a waveform chart for describing a method for synthesizing a pulse signal S1 and a pulse signal S2 in the integrated pulse width modulator according to the present invention.

FIG. 2 is a waveform chart for describing a method for synthesizing the pulse signal S1 and the pulse signal S2 in the integrated pulse width modulator 1 according to the present invention. FIG. 2 illustrates one example of waveforms of voltages V1 and V2 outputted from the integrators 3 and 4, the pulse signals S1 and S2 generated by the pulse signal generation circuits 6 and 7, and the PWM signal $S_{PWM}$ obtained by synthesizing the pulse signals S1 and S2 when $0<e_s$.

A rise portion on the waveform of V1 indicates a change in V1 at a time when electric charges are stored in the integrator 3 by the electric current $i_{s1}$ outputted from the voltage to current converting circuit 2A, and a fall portion indicates a change in V1 at a time when the stored electric charges in the integrator 3 are discharged by a constant electric current $I_d$. Similarly, a rise portion on the waveform of V2 indicates a change in V2 at a time when electric charges are stored in the integrator 4 by the electric current $i_{s2}$ outputted from the voltage to current converting circuit 2B, and a fall portion indicates a change in V2 at a time when the stored electric charges in the integrator 4 are discharged by the constant electric current $I_d$. Waveforms indicated by dotted lines of the waveforms of V1 and V2 represent the changes in V1 and V2 at the time when $e_s=0$ (no signal).

Since the discharge times t1 and t2 of the electric charges in the integrators 3 and 4 are proportional to the electric currents $i_{s1}$ and $i_{s2}$, they can be expressed by $t1=K \cdot i_{s1}=K \cdot (I_0+k \cdot |e_s|)$ (K is proportionality coefficient), and $t2=K \cdot i_{s2}=K \cdot (I_0-k \cdot |e_s|)$. When $e_s=0$, $t1=t2=K \cdot I_0=t_0=t/2$. For this reason, when an error component $i_n$ is not present, the discharge times t1 and t2 at a time when $e_s \neq 0$ are expressed by $t1=t_0+t_s=(t+2 \cdot t_s)/2$, and $t2=t_0-t_s=(t-2 \cdot t_s)/2$ ($t_s$ is a fluctuation component based on an amplitude of the audio signal $e_s$). In FIG. 2, since the pulse signals S1 and S2 are generated by a /RS flip-flop circuit using negative logic, the pulse signals S1 and S2 are pulse signals of a negative logic which are at a high level for the times t1 and t2 in which the stored electric charges in the integrators 3 and 4 are discharged.

When pulse widths of the pulse signals S1 and S2 in a case where the error component $i_n$ is generated are denoted by t1' and t2', the pulse widths t1' and t2' are expressed by $t1'=t1+t_n$, and $t2'=t2+t_n$. "$t_n$" denotes variations of the discharge times t1 and t2 of the integrators 3 and 4 on a basis of an error component.

The waveforms of V1 and V2 shown in FIG. 2 represent changes in V1 and V2 in a case where the error component is mixed, and the pulse widths of the pulse signals S1 and S2 (the time of the low level) are such that $t1'=t1+t_n$, and $t2'=t2+t_n$. A pulse width $t_{PWM}$ of the PWM signal $S_{PWM}$ in the case without the error component $i_n$ is such that $t_{PWM}=t_0+t_s$, and a modulation degree at this time is such that $m_{PWM}=[|(t1-t2)/(t1+t2)|] \times 100 = [2 \cdot t_s/t] \times 100$.

The integrated pulse width modulator 1 outputs a pulse P1 of a pulse width t1' and a pulse P2 of a pulse width t2' alternately in a period t as indicated by the waveforms of the pulse signals S1 and S2 in FIG. 2. The pulse P1 and the pulse P2 are synthesized with each other so that a pulse P3 with a pulse width t3 and a period T' is generated, and the pulse P3 is outputted as each pulse of the PWM signal $S_{PWM}$. As a result, the modulation degree $m_{PWM}$ of the PWM signal $S_{PWM}$ is such that $m_{PWM}=[|t3-(T'-t3)|/T'] \times 100 = [|2 \cdot t3 - T'|/T'] \times 100$. For this reason, when the pulse P3 having the pulse width t3 that satisfies $|2 \cdot t3 - T'|/T' = (2 \cdot t_s/t)$ can be synthesized from the pulse P1 and the pulse P2, the PWM signal $S_{PWM}$ where the error component $i_n$ is canceled can be generated.

In the waveform chart in FIG. 2, the pulse signal S1 and the pulse signal S2 are synthesized so that a pulse whose pulse width is a time from the pulse P2 of the pulse signal S2 is generated to the pulse P1 of the pulse signal S1 is generated, namely, the time between a fall timing of the pulse P2 (see timing a in FIG. 2) and a fall timing of the pulse P1 (see timing b in FIG. 2) is generated, and the PWM signal $S_{PWM}$ is generated. As a result, the pulse width $t_{PWM}$ of the PWM signal $S_{PWM}$ is such that $t_{PWM}=(t-t2')+t1'$.

Because of $t_{PWM}=t+t1-t2=t+2 \cdot t_s$ according to $t1'=t1+t_n$, $t2'=t2+t_n$, the period T' of the PWM signal $S_{PWM}$ is $2 \cdot t$, and the modulation degree $m_{PWM}$ of PWM signal $S_{PWM}$ is such that, $m=[|t+2 \cdot t_s-2 \cdot t+2 \cdot t_s|/(2 \cdot t)] \times 100=[2 \cdot t_s/t] \times 100$, and the above condition is satisfied. Therefore, the PWM signal $S_{PWM}$ obtained by synthesizing the pulse signal S1 and the pulse signal S2 according to the above method is PWM signal where the error component $i_n$ is canceled.

A discharge timing detection circuit 81 in the PWM signal generation circuit 8 is a circuit for detecting the fall timing of the pulse P1 (discharge end timing of the integrator 3) and the fall timing of the pulse P2 (discharge end timing of the integrator 4). Further, a pulse generation circuit 82 in the PWM signal generation circuit 8 is a circuit for generating a pulse whose pulse width is the time between the fall timing of the pulse P2 and the fall timing of the pulse P1 using a signal obtained by detecting the fall timing of the pulses P1 and P2 through the discharge timing detection circuit 81, and outputting the pulse as the PWM signal $S_{PWM}$.

In the PWM signal $S_{PWM}$ that is generated by synthesizing the pulse signal S1 and the pulse signal S2 according to the above method, since the modulation degree $m_{PWM}=[2 \cdot t_s/t] \times 100$ becomes "0" at the time of no signal ($e_s=0$), generation of an offset voltage can be also prevented.

Figure 3:
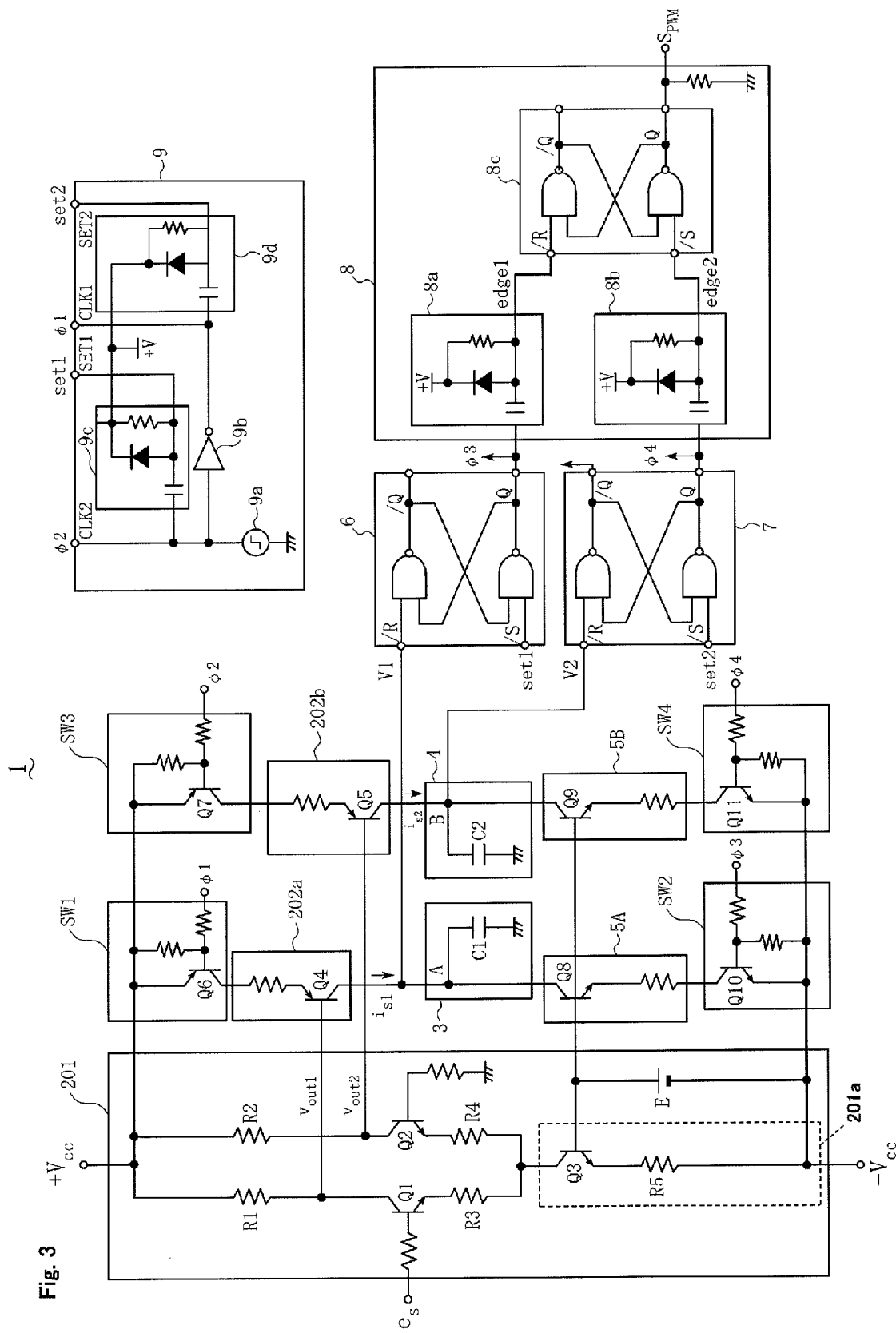
FIG. 3 is a diagram illustrating one example of a concrete circuit configuration of the integrated pulse width modulator according to the present invention.
Figure 4:
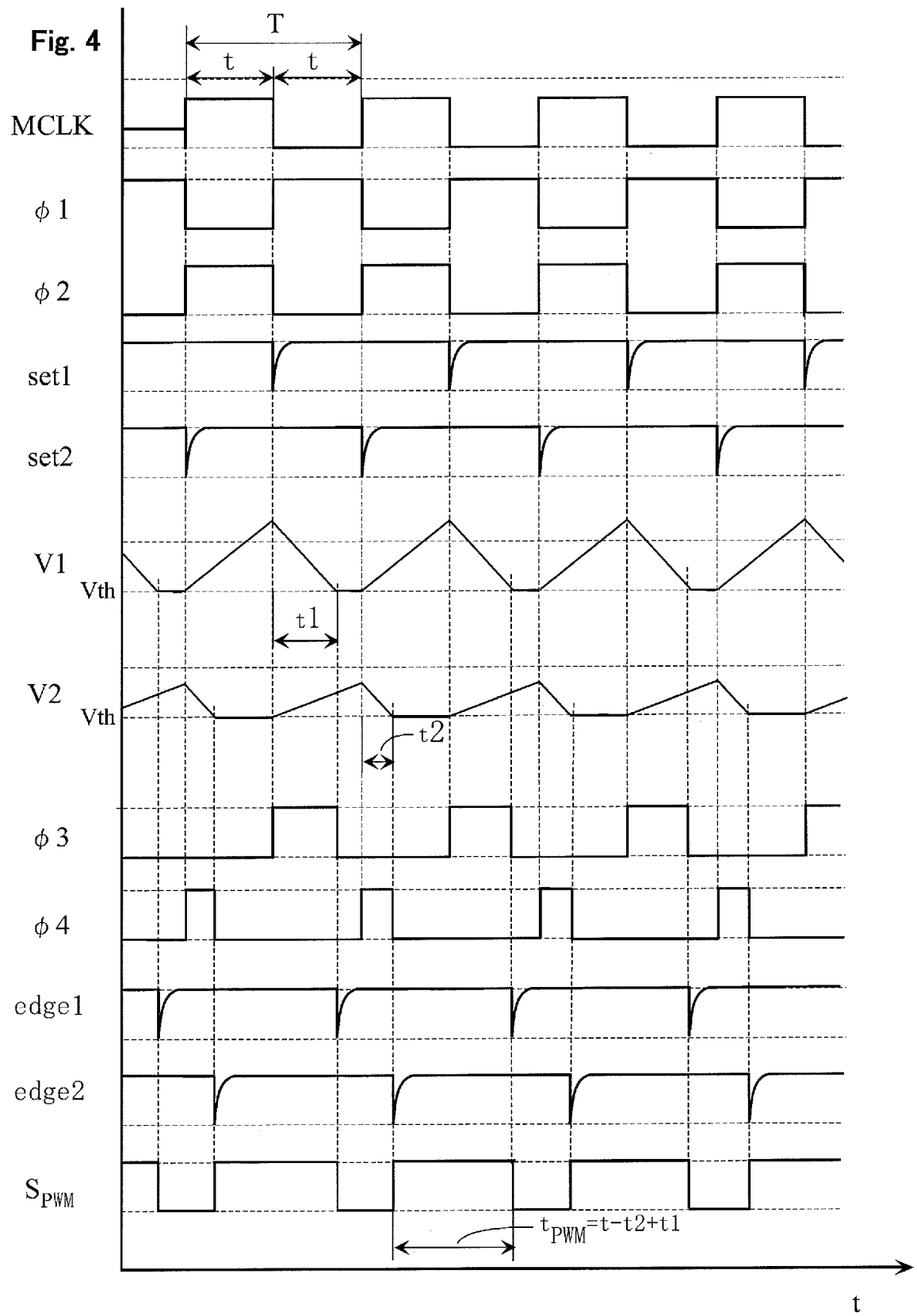
FIG. 4 is a time chart illustrating an operation for generating a PWM signal in the integrated pulse width modulator shown in FIG. 3.

FIG. 3 is a diagram illustrating one example of a concrete circuit configuration of the integrated pulse width modulator 1. FIG. 4 is a time chart illustrating an operation for generating the PWM signal $S_{PWM}$ of the integrated pulse width modulator 1 shown in FIG. 3. In FIG. 1, the discharging circuit 5 is commonly used for discharging the stored electric charges in the integrators 3 and 4, but in FIG. 3, a discharging circuit 5A for discharging the integrator 3 and a discharging circuit 5B for discharging the integrator 4 are provided.

The control signal generation circuit 9 includes a clock 9a for generating a reference clock MCLK, an inverter 9b for inverting a level of the reference clock MCLK, a differentiator 9c for detecting a fall timing of the reference clock MCLK, and a differentiator 9d for detecting a fall timing of a signal obtained by inverting the level of the reference clock MCLK.

The clock 9a, as shown in FIG. 4, generates a reference clock MCLK where a period $T=2t$ and a duty ratio is 50%. The reference clock MCLK whose level is inverted by the inverter 9b, and an inverted signal is outputted as a control signal φ1 from an output terminal CLK1. Further, the reference clock MCLK is outputted as a control signal φ2 from an output terminal CLK2 (see the waveforms of φ1 and φ2 in FIG. 4).

The differentiator 9c and the differentiator 9d are CR circuits having the same configuration composed of an L-shaped circuit including a capacitor and a resistor. The differentiator 9c is provided between the clock 9a and an output terminal SET1. Every time when the control signal φ2 (the reference clock MCLK) falls, the differentiator 9c outputs a signal, which is obtained by detecting a change in the level (a signal that changes instantly into a low level from a high level and returns to the high level in a differentiation waveform of the level change) as a set signal set1 from the output terminal SET1 (see the waveform of set1 in FIG. 4). The differentiator 9d is provided between the clock 9a and an output terminal SET2. Every time when the control signal φ1 (a level inverted signal of the reference clock MCLK) falls, the differentiator 9d outputs a signal obtained by detecting a level change (changed instantly into the low level from the high level, and returns into the high level in the differentiated waveform of the level change) as a set signal set2 from the output terminal SET2 (see the waveform of set2 in FIG. 4).

The two voltage to current converting circuits 2A and 2B are composed of a differential amplifier circuit 201, and two current generation circuits 202a and 202b. The differential amplifier circuit 201 is a known differential amplifier circuit such that collectors of two transistors Q1 and Q2 having the same characteristics are connected to a positive power supply $+V_{cc}$ by resistors R1 and R2 having the same characteristics, whereas emitters of the transistors Q1 and Q2 are connected to a constant current circuit 201a by resistors R3 and R4 having the same characteristics. The constant current circuit 201a is a known constant current circuit using a pnp type transistor Q3. An emitter of the transistor Q3 is connected to a negative power supply $-V_{cc}$ via a resistor R5. In the constant current circuit 201a shown in FIG. 3, a reference voltage to be set in a base of the transistor Q3 is set by a power supply E.

The audio signal $e_s$ is inputted into a base of the transistor Q1 of the differential amplifier circuit 201, and a base of the transistor Q2 is set to a reference level of the audio signal $e_s$ (in this embodiment, the ground level). Two output voltages $v_{out1}$, $v_{out2}$ of the differential amplifier circuit 201 are outputted from the transistors Q1 and Q2, respectively. A difference voltage ($v_{out1}-v_{out2}$) between the voltage $v_{out1}$ and the voltage $v_{out2}$ is obtained by amplifying a difference voltage $e_s$ between two input voltages $e_s$, 0[v] (ground level).

When electric currents flowing in collectors of the transistors Q1 and Q2 of the differential amplifier circuit 201 are denoted by $i_1$ and $i_2$, respectively, and an electric current supplied from the power supply +V is denoted by $I_{cc}$, a relationship such that $i_1+i_2=I_{cc}$ is established. Further, when resistances of the resistors R1 and R2 are denoted by r, the two output voltages (collector voltages of the transistors Q1 and Q2) $v_{out1}$ and $v_{out2}$ of the differential amplifier circuit 201 are expressed by $v_{out1}=V_{cc}-r\cdot i_1$ and $v_{out2}=V_{cc}-r\cdot i_2$, respectively.

Because of $v_{out1}-v_{out2}=G\cdot e_s$ (G: gain), according to $r\cdot(I_{cc}-2\cdot i_1)=G\cdot e_s$, the electric currents $i_1$ and $i_2$ are expressed by:

$$i_1 = I_{cc}/2 - |G\cdot e_s|/(2\cdot r) = I_c - \Delta i$$

$$i_2 = I_{cc} - i_1 = I_{cc}/2 + |G\cdot e_s|/(2\cdot r) = I_c + \Delta i.$$

Here, $I_c=I_{cc}/2$, $|G\cdot e_s|/(2\cdot r)=\Delta i$. When the audio signal $e_s$ is a reference level (0[v]) (no signal), according to $v_{out1}-v_{out2}=r\cdot(I_{cc}-2\cdot i_1)=0$, $I_c$ is the electric currents flowing in the resistors R1 and R2 at the time of no signal.

When the electric currents $i_1$ and $i_2$ are assigned to the above formulas of the output voltages $v_{out1}$ and $v_{out2}$, the output voltages $v_{out1}$ and $v_{out2}$ are expressed by:

$$\begin{aligned}v_{out1} &= V_{CC} - r\cdot i_1\\ &= V_{CC} - r\cdot(I_C - \Delta i)\\ &= (V_{CC} - r\cdot I_C) + r\cdot \Delta i\\ &= V_C + \Delta v_s\end{aligned}$$

$$\begin{aligned}v_{out2} &= V_{CC} - r\cdot i_2\\ &= V_{CC} - r\cdot(I_C + \Delta i)\\ &= (V_{CC} - r\cdot I_C) - r\cdot \Delta i\\ &= V_C - \Delta v_s.\end{aligned}$$

Here, $V_c=(V_{cc}-r\cdot I_c)$, and $\Delta v_s=r\cdot \Delta i=G\cdot|e_s|/2$, and $V_c$ denotes a voltage to be outputted at the time of no signal.

The current generation circuits 202a and 202b are composed of collector ground circuits having the same configurations using pnp type transistors Q4 and Q5, respectively. Emitters of the transistors Q4 and Q5 are connected to the positive power supply $+V_{cc}$ via the switching circuits SW1 and SW3 using npn type transistors Q6 and Q7, respectively, and collectors of the transistors Q4 and Q5 are connected to the integrators 3 and 4 using capacitors C1 and C2, respectively. The voltage $v_{out1}$ and the voltage $v_{out2}$ outputted from the differential amplifier circuit 201 are inputted into bases of the transistor Q4 and the transistor Q5, respectively. Further, the control signal φ1 is inputted into a base of the transistor Q6, and the control signal φ2 is inputted into a base of the transistor Q7.

The current generation circuit 202a converts the input voltage $v_{out1}$ into the electric current $i_{s1}$ that changes in proportion to a change in the voltage. The current generation circuit 202b converts the input voltage $v_{out2}$ into the electric current $i_{s2}$ that changes in proportion to a change in the voltage. When conversion conductance of the current generation circuits 202a and 202b is denoted by Gm, the electric currents $i_{s1}$ and $i_{s2}$ to be outputted from the current generation circuits 202a and 202b, respectively, are expressed by:

$$i_{s1} = Gm\cdot v_{out1} = Gm\cdot(V_c+\Delta v_s) = I_o + \Delta i_s$$

$$i_{s2} = Gm\cdot v_{out2} = Gm\cdot(V_c-\Delta v_s) = I_o - \Delta i_s.$$

Here, $I_o=Gm\cdot V_o$, $\Delta i_s=Gm\cdot \Delta v_s=Gm\cdot G\cdot|e_s|/2=k\cdot|e_s|$ ($k=Gm\cdot G/2$), and $I_o$ denotes an electric current output at the time of no signal.

Since the transistor Q6 of the switching circuit SW1 and the transistor Q7 of the switching circuit SW2 are active at the low level, the switching circuit SW1 is ON in the term where the control signal φ1 is at the low-level, and is OFF in the term of the high level. Further, the transistor Q7 of the switching circuit SW3 is ON in the term in which the control signal φ2 is at the low level, and is OFF in the term of the high level. Therefore, the current generation circuit 202a is connected to the positive power supply $+V_{cc}$ only in the term in which the control signal φ1 is at the low level, and outputs the electric current $i_{s1}$ to the integrator 3 (the capacitor C1 is charged). The current generation circuit 202b is connected to the positive power supply $+V_{cc}$ only in the term in which the control signal φ2 is at the low level, and outputs the electric current $i_{s2}$ to the integrator 4 (the capacitor C2 is charged).

As a result, the voltages V1 and V2 of the capacitors C1 and C2 rise from a reference level $V_{th}$ (=0[v]) to predetermined levels $V_{j1}$ and $V_{j2}$ (hereinafter, referred to as "charging voltages" of this level). Since a charging voltage $V_j$ at a time when a capacitor of capacitance C is charged with an electric current I for a time T is such that $V_j=I\times T$, the voltage V1 of the capacitor C1 rises to $V_{j1}=i_{s1}\cdot t=(I_o+\Delta i_s)\cdot t$, and the voltage V2 of the capacitor C2 rises to $V_{j2}=i_{s2}\cdot t=(I_o-\Delta i_s)\cdot t$ (see rise portions of the waveforms of V1 and V2 in FIG. 4).

A connecting point A between the integrator 3 and the current generation circuit 202a is connected to the negative power supply $-V_{cc}$ via a series circuit configured by the discharging circuit 5A and the switching circuit SW2. A connecting point B between the integrator 4 and the current generation circuit 202b is connected to the negative power supply $-V_{cc}$ via a series circuit configured by the discharging circuit 5B and the switching circuit SW4.

The discharging circuits 5A and 5B have the same circuit configuration as that of the constant current circuit 201a of the differential amplifier circuit 201. Since the power supply E for the reference voltage of the constant current circuit 201a is commonly used for the reference voltages of the discharging circuits 5A and 5B, the power supply E is connected also to transistors Q8 and Q9 of the discharging circuits 5A and 5B. The switching circuits SW2 and SW4 are semiconductor switches using pnp type transistors Q10 and Q11, respectively. Since drive voltage of the switching circuits SW1 and SW3 is positive power supply voltage $+V_{cc}$, npn type transistors are used. Since drive voltage of the switching circuits SW2 and SW4 is negative power supply voltage $-V_{cc}$, pnp type transistors are used. The switching circuits SW1 to SW4 have the same characteristics.

A control signal φ3 outputted from the pulse signal generation circuit 6 is inputted into a base of the transistor Q10, and a control signal φ4 outputted from the pulse signal generation circuit 7 is inputted into a base of the transistor Q11. As shown in FIG. 4, the control signal φ3 is a pulse signal whose pulse width is the discharge time t1 of the integrator 3. The control signal φ4 is a pulse signal whose pulse width is the discharge time t2 of the integrator 4.

Since the transistor Q10 and the transistor Q11 are active at the high level, the switching circuit SW2 is ON in the term in which the control signal φ3 is at the high level, and is OFF at in low-level term. Further, the switching circuit SW4 is ON in the term in which the control signal φ4 is at the high level, and is OFF in the low-level term. Therefore, the discharging circuit 5A is connected to the negative power supply $-V_{cc}$ in the term in which the control signal φ3 is at the high level, and the stored electric charges of the integrator 3 are discharged with the constant electric current $I_d$. The discharging circuit 5B is connected to the negative power supply $-V_{cc}$ in the term in which the control signal φ4 is at the high level, and the stored electric charges of the integrator 4 are discharged with the constant electric current $I_d$ (see fall portions on the waveforms of V1 and V2 in FIG. 4).

The pulse signal generation circuits 6 and 7 are composed of known /RS flip-flop circuits using two NAND circuits. The voltage V1 of the capacitor C1 and the set signal set1 outputted from the control signal generation circuit 9 are inputted into a /R input and an /S input of the pulse signal generation circuit 6, respectively. The voltage V2 of the capacitor C2 and the set signal set2 outputted from the control signal generation circuit 9 are inputted into a /R input and an /S input of the pulse signal generation circuit 7, respectively. The control signal φ3 is outputted from a Q output of the pulse signal generation circuit 6, and the control signal φ4 is outputted from a Q output of the pulse signal generation circuit 7.

In the /RS flip-flop circuit using a NAND circuit, when an input of (/S, /R) is maintained in a state of (high, high), an output of (Q, /Q) is maintained in a state of (high, low). In this state, a signal for a low level is inputted into the /R input, and the /RS flip-flop circuit converts the output state of (Q, /Q) into (low, high). A signal for a low level is then inputted into the /S input, and the /RS flip-flop circuit converts the output state of (Q, /Q) into (high, low).

Therefore, in the pulse signal generation circuit 6, when fall of the control signal φ2 is detected and the set signal set1 that is instantly at the low level is inputted into the /S input, the output state of (Q, /Q) is made to be (high, low). When the voltage V1 of the capacitor C1 inputted as a reset signal into the /R input is lowered to the reference level $V_{th}$ (a threshold level of the /RS flip-flop circuit) due to discharge, the output state of (Q, /Q) is made to be (low, high). Further, in the pulse signal generation circuit 7, when the fall of the control signal φ1 is detected and the set signal set2 that is instantly at the low level is inputted into the /S input, the output state of (Q, /Q) is made to be (high, low). When the voltage V2 of the capacitor C2 inputted as a reset signal into the /R input is lowered to the reference level $V_{th}$ due to discharge, the output state of (Q, /Q) is made to be (low, high).

The set signal set1 and the voltage V1 that is lowered to the reference level $V_{th}$ are inputted alternately to the pulse signal generation circuit 6, but the input timing of the set signal set1 is the discharge start timing of the capacitor C1. For this reason, a pulse signal that is at the high level for the discharge time t1 of the capacitor C1 is outputted as the control signal φ3 from the Q output of the pulse signal generation circuit 6 (see the waveform of φ3 in FIG. 4). Similarly, the set signal set2 and the voltage V2 that is lowered to the reference level $V_{th}$ are alternately inputted into the pulse signal generation circuit 7, but the input timing of the set signal set2 is the discharge start timing of the capacitor C2. For this reason, a pulse signal that is at the high level for the discharge time t2 of the capacitor C2 is outputted as the control signal φ4 from the Q output of the pulse signal generation circuit 7 (see the waveform of φ4 in FIG. 4).

The PWM signal generation circuit 8 is composed of two differentiators 8a and 8b and a /RS flip-flop circuit 8c using a NAND circuit. The two differentiators 8a and 8b correspond to the discharge timing detection circuit 81, and the /RS flip-flop circuit 8c corresponds to the pulse generation circuit 82. The differentiators 8a and 8b have the same circuit configuration as that of the differentiator 9c and 9d of the control signal generation circuit 9.

The differentiator 8a detects fall timing of a signal outputted from the Q output of the pulse signal generation circuit 6. The differentiator 8b detects a fall timing of a signal outputted from the Q output of the pulse signal generation circuit 7. The signal outputted from the Q output of pulse signal generation circuit 6 corresponds to the pulse signal S1. The signal outputted from the Q output of pulse signal generation circuit 7 corresponds to the pulse signal S2. Therefore, the differentiator 8a outputs the signal obtained by detecting the level change every time when the pulse signal S1 falls (the signal that instantly changes from the high level into the low level) (see a waveform of edge1 in FIG. 4). The differentiator 8b outputs the signal obtained by detecting the level change every time when the pulse signal S2 falls (the signal that instantly changes from the high level into the low level) (see a waveform of edge2 in FIG. 4).

The /RS flip-flop circuit 8c has the same circuit configuration as that of the /RS flip-flop circuits of the pulse signal generation circuits 6 and 7. The signal edge1 outputted from the differentiator 8a is inputted into a /R input of the /RS flip-flop circuit 8c. The signal edge2 outputted from the differentiator 8b is inputted into a /S input of the /RS flip-flop circuit 8c. The PWM signal $S_{PWM}$ is outputted from the Q output of the /RS flip-flop circuit 8c.

In the /RS flip-flop circuit 8c, the signal edge1 is inputted into the /R input, and the output state of (Q, /Q) is changed into (low, high). The signal edge2 is inputted into the /S input, and the output state of (Q, /Q) is changed into (high, low). The signal edge1 and the signal edge2 are inputted into the PWM signal generation circuit 8 alternately, but the input timing of the signal edge2 is discharge end timing of the capacitor C2, and the input timing of the signal edge1 is the discharge end timing of the capacitor C1. For this reason, a pulse signal, whose pulse width is the time between the discharge end timing of the capacitor C2 (corresponding to timing a in FIG. 2) and the discharge end timing of the capacitor C1 (corresponding to timing b in FIG. 2), is outputted as the PWM signal $S_{PWM}$ from the Q output of the /RS flip-flop circuit 8c.

The pulse width $t_{PWM}$ of the PWM signal $S_{PWM}$ outputted from the PWM signal generation circuit 8 is, as shown in FIG. 4, such that $t_{PWM}=(t-t1)+t2$. For this reason, as shown in FIG. 2, the modulation degree $m_{PWM}$ of the PWM signal $S_{PWM}$ is such that $m_{PWM}=[2 \cdot t_s/t] \times 100$, and the PWM signal $S_{PWM}$ where a common-mode noise or harmonics is canceled is outputted from the PWM signal generation circuit 8.

Figure 5:
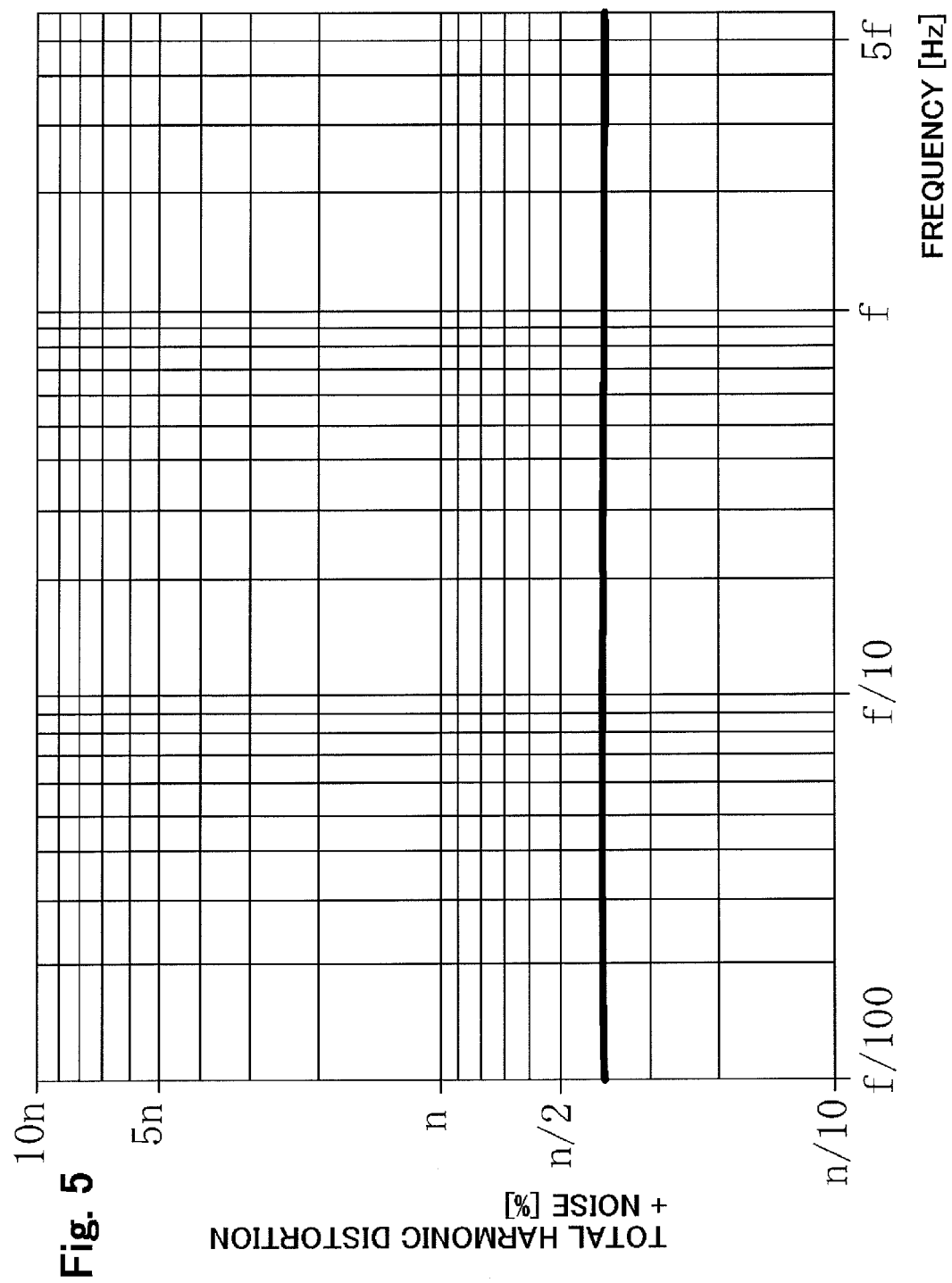
FIG. 5 is a diagram illustrating frequency-total harmonic distortion+noise characteristics of the integrated pulse width modulator according to the present invention.

FIG. 5 illustrates one example of frequency-total harmonic distortion+noise characteristics of the integrated pulse width modulator 1.

In the conventional integrated pulse width modulator 100, when a frequency is higher, a distortion factor tends to be gradually deteriorated. In the integrated pulse width modulator 1 of the present invention, however, a total harmonic distortion+noise is greatly improved with respect to the conventional integrated pulse width modulator 100, distortion characteristics are approximately flat, and thus the total harmonic distortion+noise is not deteriorated in proportion to an increase in the frequency. Therefore, according to the integrated pulse width modulator 1 of the present invention, quality of a reproduction sound of the PWM signal $S_{PWM}$ can be greatly improved.

Figure 6:
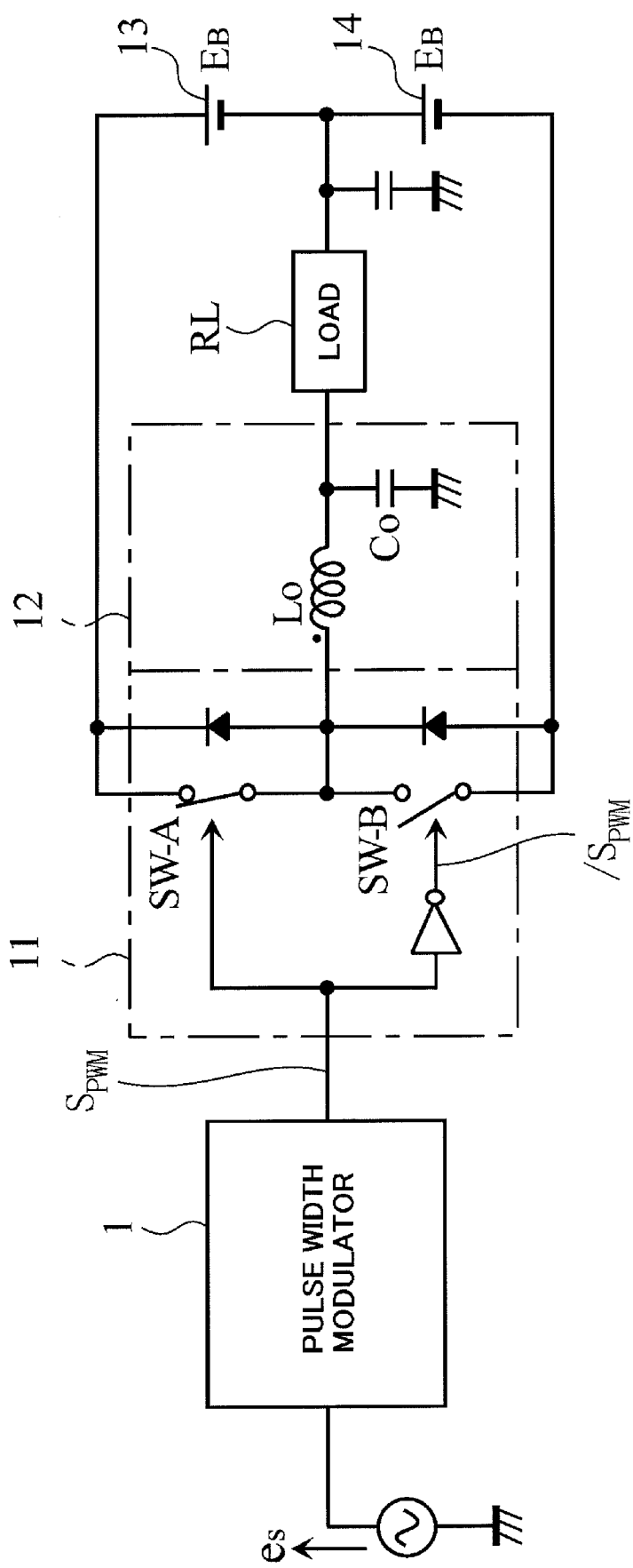
FIG. 6 is a diagram illustrating a basic configuration of a switching amplifier to which the integrated pulse width modulator is applied according to the present invention.

FIG. 6 is a diagram illustrating a basic configuration of a switching amplifier to which the integrated pulse width modulator 1 is applied.

A switching amplifier 10 is configured so that a switching circuit 11 and a low-pass filter 12 are connected at a rear stage of the integrated pulse width modulator 1, and a reproduction sound of the PWM signal $S_{PWM}$ outputted from the low-pass filter 12 is supplied to a speaker as a load RL.

The switching circuit 11 is configured so that a series circuit of a switch element SW-A and a switch element SW-B is connected between a first power supply 13 for supplying a positive power supply voltage $+E_B$ and a second power supply 14 for supplying a negative power supply voltage $-E_B$. The switching circuit 11 performs an ON-OFF operation on the switch element SW-A and the switch element SW-B alternately, and amplifies an amplitude of a control signal for controlling the ON-OFF operation of the switch element SW-A into an amplitude of a difference voltage $2 \cdot E_B$ between the voltage $+E_B$ and the voltage $-E_B$ so as to output the amplified signal.

The ON-OFF operation of the switch element SW-A is controlled by the PWM signal $S_{PWM}$ outputted from the integrated pulse width modulator 1, and the ON-OFF operation of the switch element SW-B is controlled by a PWM signal/$S_{PWM}$ obtained by inverting the level of the PWM signal $S_{PWM}$ through an inverter. Therefore, a signal obtained by amplifying the amplitude of the PWM signal $S_{PWM}$ into an amplitude of the difference voltage $2 \cdot E_B$ between the power supply $+E_B$ and the power supply $-E_B$ is outputted from the switching circuit 11, and this signal is reproduced into a waveform of the audio signal $e_s$ to be inputted into the integrated pulse width modulation circuit 1 by the low-pass filter 12 so that an audio is outputted from the speaker (load RL).

The period of the PWM signal $S_{PWM}$ generated by the conventional integrated pulse width modulator 100 is ½ of the period T of the reference clock MCLK, whereas the period of the PWM signal $S_{PWM}$ generated by the integrated pulse width modulator 1 of the present invention is the same as the period of the reference clock MCLK. Therefore, when the PWM signal $S_{PWM}$ with the same period as that of the conventional integrated pulse width modulator 100 is desired to be generated, the period of the reference clock MCLK may be set to be ½.

The above embodiment describes the circuit configuration for changing the charging voltages $V_j$ of the capacitors C1 and C2 from the reference level $V_{th}$ to the + direction, but the present invention can be applied also to the circuit configuration for changing the charging voltages $V_j$ of the capacitors C1 and C2 from the reference level $V_{th}$ to a minus direction. Therefore, the waveforms of respective signals shown in FIG. 4 correspond to concrete circuits of the integrated pulse width modulator 1 shown in FIG. 3, and it goes without saying that when each circuit block of the integrated pulse width modulator 1 has another circuit configuration, polarities of the waveforms of the respective signals shown in FIG. 4 suitably change according to the change in the circuit configuration.

The integrated pulse width modulator 1 of the present invention is characterized by:

(A) converting the audio signal $e_s$ into the electric current $i_{s1}=I_o+k \cdot |e_s|$ expressed by a linear function having an inclination proportional to its amplitude and the electric current $i_{s2}=I_o-k \cdot |e_s|$ having an inclination opposite to the electric current $i_{s2}$;

(B) performing a charging and discharging operation for charging one of the two integrators having the same characteristics with the electric current $i_{s1}$ for the predetermined time t and discharging it with the predetermined constant electric current $I_d$, and a charging operation for the other one with the electric current $i_{s2}$ for the time t and discharging it with the constant electric current $I_d$ with these operations being shifted by time t alternately in the period of $2 \cdot t$; and (C) detecting the discharge end timing of the other integrator charged with the electric current $i_{s2}$ (corresponding to the timing a in FIG. 2. Hereinafter, referred to as "first discharge end timing") and the discharge end timing of the one integrator charged with the electric current $i_{s1}$ continuously generated at the discharge end timing (corresponding to the timing b in FIG. 2. Hereinafter, referred to as "second discharge end timing"), and generating the PWM signal $S_{PWM}$ whose pulse width is a time interval between both the detecting timings.

Therefore, the configuration that can realize above (A) to (C) enables adoption of any circuit elements and circuit configurations. For example, the integrator is not limited to capacity elements but can use various electronic parts for enabling storage of electric charges with the electric currents $i_{s1}$ and $i_{s2}$. Further, in FIG. 3, the bi-polar transistors are used, but another semiconductor element or semiconductor integrated circuit element such as a field effect transistor can be used.

What is claimed is:

1. A pulse width modulator comprising:

a first voltage to current converting section for converting an AC voltage signal to be inputted into a first electric current expressed by a linear function having an inclination proportional to an amplitude of the AC voltage signal;

a second voltage to current converting section for converting the AC voltage signal into a second electric current having an inclination opposite to the first electric current;

a first charging/discharging control section for repeating a charging/discharging operation for charging a first electric charge storage section with the first electric current for a predetermined time and discharging the electric charges stored in the first electric charge storage section with a predetermined constant current in a period twice as long as the predetermined time;

a second charging/discharging control section for repeating a charging/discharging operation for charging a second electric charge storage section with the second electric current for the predetermined time and discharging the electric charges stored in the second electric charge storage section with the predetermined constant current in the period with shifting the predetermined time for the charging/discharging operation of the first electric charge storage section through the first charging/discharging control section;

a first discharge timing detecting section for detecting the discharge end timing every time when the discharge of the stored electric charges in the second electric charge storage section is ended;

a second discharge timing detecting section for detecting the discharge end timing every time when the discharge of the stored electric charges in the first electric charge storage section is ended; and a pulse width modulation signal generation section for generating a pulse whose pulse width is a time interval between a first discharge end timing detected by the first discharge timing detecting section and a subsequent second discharge end timing detected by the second discharge timing detecting section, and outputting a signal of a pulse string as a pulse width modulation signal.

2. The pulse width modulator according to claim 1, wherein the first voltage to current converting section includes a differential amplifier circuit which the AC voltage signal is inputted into its one input, and which a feedback signal that is fed back in order to correct the AC voltage signal is inputted into the other input or whose the other input is set to the reference level of the AC voltage signal, and a first electric current generation circuit for generating an electric current proportional to one of the output voltages from the differential amplifier circuit, the second voltage to current converting section includes the differential amplifier circuit, and a second electric current generation circuit for generating an electric current proportional to the other output voltage from the differential amplifier circuit.

3. The pulse width modulator according to claim 1, wherein the first charging/discharging control section includes a first control signal generation section for outputting a first control signal composed of a clock signal having the period and a first detection signal for detecting a timing at which a level of the first control signal is inverted to a predetermined direction, a second control signal generation section for generating a second control signal composed of a pulse signal whose pulse width is a discharge time of the first electric charge storage section based on the first detection signal and a level of a discharging voltage of the first electric charge storage section, a first switching section that is provided between the first voltage to current converting section and the first electric charge storage section, and controls connection between the first voltage to current converting section and the first electric charge storage section according to the first control signal, a first discharging section that is provided between the first electric charge storage section and a ground line or a power supply line, and discharges the stored electric charges of the first electric charge storage section with the predetermined constant current to the ground line or the power supply line when the first discharging section is connected to the first electric charge storage section, and a second switching section that is provided between the first electric charge storage section and the first discharging section, and controls connection between the first electric charge storage section and the first discharging section according to the second control signal, the second charging/discharging control section includes a third control signal generation section for outputting a third control signal obtained by inverting a level of the first control signal, and a second detection signal for detecting a timing at which a level of the third control signal is inverted to the predetermined direction, a fourth control signal generation section for generating a fourth control signal composed of a pulse signal whose pulse width is a discharge time of the second electric charge storage section based on the second detection signal and a level of a discharging voltage of the second electric charge storage section, a third switching section that is provided between the second voltage to current converting section and the second electric charge storage section, and controls connection between the second voltage to current converting section and the second electric charge storage section according to the second control signal, a second discharging section that is provided between the second electric charge storage section and a ground line or a power supply line, and discharges the stored electric charges of the second electric charge storage section into the ground line or the power supply line with the predetermined constant current when the second discharging section is connected to the second electric charge storage section, a fourth switching section that is provided between the second electric charge storage section and the second discharging section, and controls connection between the second electric charge storage section and the second discharging section according to the fourth control signal.

4. The pulse width modulator according to claim 3, wherein the first control signal generation section and the second control signal generation section are composed of a control signal generation circuit including a reference clock generation circuit for generating a reference clock having the period, and outputting the reference clock as the second control signal, a level inverting circuit for inverting a level of the reference clock so as to output the reference clock as the first control signal, a first differentiator for, when the level of the reference clock is inverted into the predetermined direction, outputting a signal having a differentiated waveform of the level change as the second detection signal, and a second differentiator for, when a level of a signal outputted from the level inverting circuit is inverted into a predetermined direction, outputting a signal having a differentiated waveform of a level change as the first detection signal.

5. A switching amplifier comprising:

the pulse width modulator according to claim 1;

a voltage supply for outputting a predetermined power supply voltage; and a switching circuit for switching a predetermined power supply voltage supplied from the voltage supply based on a pulse width modulation signal output from the pulse width modulator.

* * * * *